United States Patent [19]

Buxton

[11] Patent Number: 4,925,085
[45] Date of Patent: May 15, 1990

[54] BONDING MEANS AND METHOD
[75] Inventor: Howard D. Buxton, Phoenix, Ariz.
[73] Assignee: Motorola Inc., Schaumburg, Ill.
[21] Appl. No.: 356,473
[22] Filed: May 25, 1989
[51] Int. Cl.$^5$ .................. B23K 20/26; B23K 31/00
[52] U.S. Cl. ................................. 228/179; 228/4.5; 219/56.21
[58] Field of Search ............... 228/179, 4.5, 244, 1.1, 228/41, 904; 219/56.21, 56.22

[56] References Cited

U.S. PATENT DOCUMENTS 3,787,966  1/1974  Klossika ........................ 228/4.5
4,418,858 12/1983  Miller ........................... 228/4.5

FOREIGN PATENT DOCUMENTS 137221  8/1983  Japan ............................ 228/4.5
899303  1/1982  U.S.S.R. ...................... 219/56.21

Primary Examiner—Nicholas P. Godici
Assistant Examiner—Samuel M. Heinrich
Attorney, Agent, or Firm—Robert M. Handy

[57] ABSTRACT

An improved means and method for bonding closely spaced parallel wires for applications in electronic devices, circuits and assemblies is described herein. A wire guiding means is provided located between a bonding wedge and a releasable wire clamp of a conventional wire bonder. The wire guide means has a slot which constrains motion of the wire during bonding to a plane perpendicular to the plane of the bonding pad and substantially prevents motion of the wire transverse to this perpendicular plane. This prevents the bonding from introducing minute variations in the transverse displacement of the wires, such variations being absorbed by small variations in the wire loop height.

16 Claims, 2 Drawing Sheets

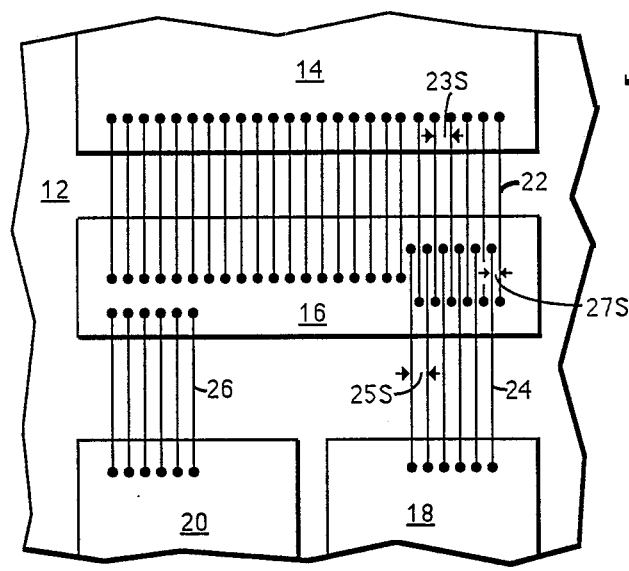
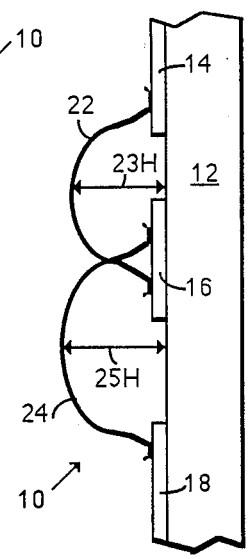
FIG. 1    FIG. 2
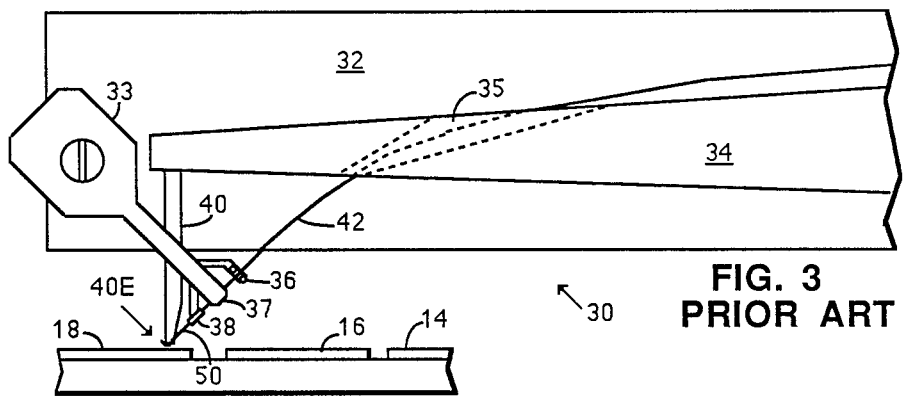
FIG. 3
PRIOR ART
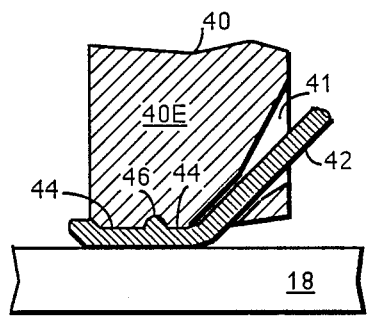
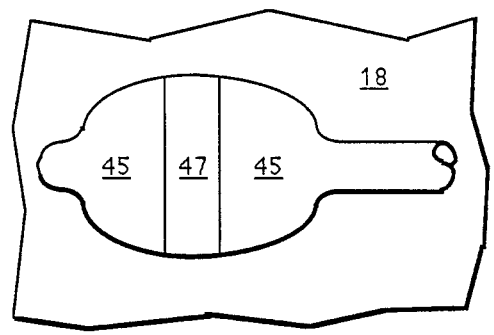
FIG. 4    FIG. 5

BONDING MEANS AND METHOD

FIELD OF THE INVENTION

This invention concerns improved means and method for attaching wires to semiconductor devices and, more particularly, improved means and method for attaching evenly spaced wires to semiconductor devices.

BACKGROUND OF THE INVENTION

It is well known in the electronic arts to make connections to semiconductor devices and integrated circuits and the like, by bonding of thin wires to bonding pads provided on these devices. Gold, aluminum, copper and alloys thereof are examples of materials which are commonly used for bonding pads and/or for connecting wires.

A well known method for attaching wires to bonding pads on semiconductor devices and the like is by thermo-compression bonding. In a typical arrangement, a thin wire of, for example, gold or aluminum, is captured between the bonding pad to which attachment is to be made and a bonding wedge. Pressure is applied to the bonding wedge to partially compress the captured wire and the bonding wedge is rapidly scrubbed back and forth, usually using ultrasonic energy. The combination of pressure and the heat generated by the scrubbing produces a weld between the wire and the bonding pad. During the bonding process, the portion of the wire captured between the bonding wedge and the bonding pad is substantially flattened.

For certain types of devices, as for example RF transistors or integrated circuits, it is necessary to provide many closely spaced parallel wire connections between the bonding regions on the device and the bonding regions on leadframe or circuit board on which the device is mounted. Often, the connecting wires must be bonded to the device and to the board or leadframe so that they have carefully controlled predetermined loop heights and spacings. This is because, at the frequencies at which many RF devices operate, the length, curvature, and spatial relationship between the bonding wires and the rest of the circuit exerts a substantial influence on the parasitic inductance and capacitance. Parasitic inductance and capacitance of the interconnections can have a profound effect on overall performance. Thus, in fabricating such RF devices and circuits, it is very important to be able to provide evenly spaced uniform wire bonds.

As device sizes are reduced the wires must be even more closely spaced and small deviations in wire spacing and/or alignment become electrically more significant. Also, as the speed of bonding and the degree of automation associated with the bonding process increase, it becomes progressively more difficult to achieve consistent, parallel, multiple, closelyspaced wire bonds. Accordingly, a need continues to exist for improved means and methods for wirebonding which permit one to obtain very evenly spaced uniform wire bonds having extremely well controlled wire loop size and orientation, particularly when a large number of closely spaced wires and wire bonds must be utilized.

BRIEF SUMMARY OF THE INVENTION

It is an object of the present invention to provide an improved means and method for attaching connecting wires to semiconductor devices, integrated circuits, and other forms of electronic circuits.

It is a further object of the present invention to perform such functions under circumstances where lateral displacement of the bonded wire from its intended position is minimized. It is an additional object of the present invention to provide an improved means and method for making many closely spaced parallel wire bond loops having uniform and consistent separation.

The foregoing and other objects and advantages are achieved in a first embodiment in a bonding apparatus comprising a bonding means for bonding a wire to a bonding pad, a releasable clamping means for temporarily arresting longitudinal movement of the bonding wire, and guide means located between the bonding means and the clamping means for permitting the wire to move longitudinally and perpendicular to the bonding pad but preventing the wire from otherwise moving substantially transversely. It is particularly desirable that the guide means prevent such transverse movement of the bonding wire while the clamping means is engaged on the wire and bonding is taking place.

In a preferred embodiment the guide means comprises a vertically oriented narrow slot which allows the bonding wire to move in a plane perpendicular to the bonding pad during bonding but prevents motion of the wire between the bonding means and clamping means in a direction perpendicular to this plane. It is desirable that this vertically oriented slot be open at the end facing the bonding pad and that it have a length which is in the range of about 5–10 wire diameters. The end of the wire guide means oriented toward the bonding pad is desirably angled so as to be approximately perpendicular to the longitudinal axis of the wire.

An improved method for attaching fine wires to a bonding pad lying in a first predetermined plane is obtained by providing a bonding means for pressing the wire against the bonding pad, a clamping means in close proximity to the bonding means for temporarily stopping longitudinal motion of the wire and a guide means located between the bonding means and the clamping means for limiting motion of the wire to a second plane perpendicular to the first predetermined plane, placing the bonding means on the bonding pad with a wire captured therebetween, closing the clamping means on the wire, partially crushing and welding the wire to the bonding pad while allowing the wire between the bonding means and the clamping means to move within the guide means in the second plane while substantially preventing motion of the wire in a direction approximately transverse to the second plane.

Following the foregoing welding step, the clamping means is released and the bonding wedge and wire moved to a second bonding location and the process repeated. Where it is desired to make multiple parallel wire bond loops, the bonding means is returned to a bonding location adjacent to the first bonding location and the entire process repeated. In a preferred embodiment, the method employs a guiding means comprising a vertically oriented slot placed between the bonding means and the clamping means and through which the wire passes in such a manner that the wire may move in the second plane perpendicular to the bonding pad while constrained from moving in a direction transverse to this second plane.

BRIEF DESCRIPTION OF THE DRAWINGS

FIG. 1 is simplified plan view of an electronic assembly utilizing multiple closely spaced uniform wire bond loops;

FIG. 2 is a right side simplified view of the assembly of FIG. 1;

FIG. 3 is a highly simplified view of a bonding apparatus employed for producing wire bonds and loops therebetween;

FIG. 4 is a partial cut-away and cross-sectional view, much enlarged, of the portion of FIG. 3 where bonding takes place;

FIG. 5 is a highly simplified plan view of a wire bond on a portion of an electronic assembly;

DETAILED DESCRIPTION OF THE DRAWINGS

Figure 6:
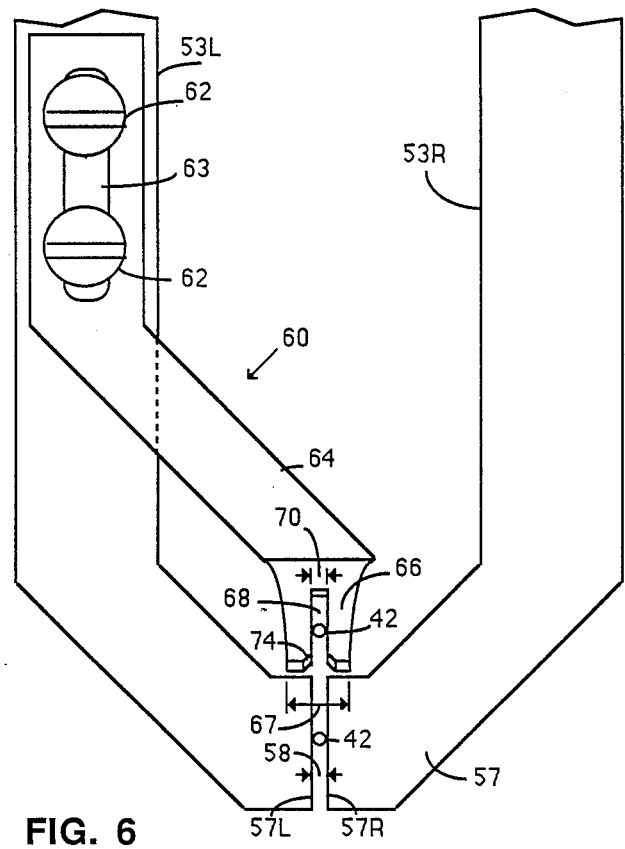
FIG. 6 is a front view of a wire guiding means according to the present invention showing its relationship to a conventional wire clamping means.

FIG. 1 shows a simplified plan view of portion 10 of an electronic assembly comprising substrate 12 on which are located bonding regions 14, 16, 18, 20 and among which extend bonding wires 22, 24, 26. Substrate 12 may be any material, as for example, a semiconductor, or a ceramic, or a printed circuit board or the like. Bonding regions 14, 16, 18, 20 are conventionally metal regions or metallized semiconductor regions, and are formed by means well known in the art. Portion 10 of an electronic assembly may consist, for example, of a semiconductor chip (e.g. 16) and adjacent connection leads (e.g. 14, 18, 20) on a printed circuit board or metallized ceramic substrate 12.

FIG. 2 is a right-side view of the assembly of FIG. 1 showing the arrangement of bonding wires 22 and 24. It will be noted in FIG. 2, that bonding wires 22, 24 do not extend between bonding regions 14, 16, 18 by the most direct straight line, but are formed so as to have loops of heights 23H and 25H respectively. Loop heights 23H, 25H should be consistently formed and be alike as much as possible.

Referring once more to FIG. 1, it will be appreciated by those of skill in that spacings 23S, 25S and 27S between bonding wires 22, 24 should, if possible, be uniform. For example, if the bonding process provides uncontrolled lateral displacement of the wires during bonding, then spacings 23S, 25S and/or 27S may not be uniform and the wire-to-wire spacing can vary in different parts of the assembly. This is highly undesirable since the wire loop height and wire spacing have an important influence on the equivalent electrical properties of the wires as part of the overall device or circuit.

FIG. 3 illustrates in a highly simplified manner, a bonding apparatus conventionally used for producing the types of wire bonds illustrated in FIGS. 1 and 2. Bonding apparatus 30 comprises support arm 32 to which is attached wire clamping means 33 and wire guides 36, 38. Transducer arm 34 extends, generally parallel to support arm 32 from a piezo electric driving transducer (not shown) which provides the scrubbing action needed for bonding.

Bonding wedge 40 is installed approximately at the end of transducer arm 34. Lower end 40E on bonding wedge 40 is shown enlarged in FIG. 4. Bonding wire 42, conventionally passes through hole 35 and transducer arm 34, through wire guide 36, between spaced apart jaws 37 of clamp 33, and through wire guide 38. Wire 42 then extends through hole 41 in foot 40E of bonding wedge 40 so as to be captured between foot 40E and, for example, bonding region 18 (see FIGS. 3-4). The arrangements shown in FIGS. 3-4 is conventional. End 40E of bonding wedge 40 has lower face 44 with, typically, groove 46 which acts to prevent slippage of wire 42 under bonding wedge 40 as it is being scrubbed in contact with bonding region 18.

FIG. 5 provides a simplified plan view of a completed bond in which face 44 of bonding wedge 40 produces flattened region 45 in wire 42 and groove 46 produces ridge 47.

FIG. 3 illustrates how, in the prior art, wire guides are provided in close proximity to movable jaws 37 of clamping means 33 so as to attempt to control the location of wire 42 during bonding. Wire guide 36 is of the type which comprises two small rods, one above and one below wire 42 extending substantially perpendicular to the plane of FIG. 3. Since the two rods associated with guiding means 36 are oriented perpendicular to the FIG. 3, they permit wire 42 to move in the direction perpendicular to the plane of FIG. 3 but constrain wire 42 so that it cannot move in the plane of FIG. 3, i.e., in the plane perpendicular to bonding pad 18.

Wire guide 38 is in the form of a small section of tubing through which wire 42 passes. Because wire 42 is typically very tiny, sections of hypodermic needle are much favored for the construction of wire guide 38. For convenience, wire guides 36 and 38 are supported by clamp means 33. Wire guide 38 constrains wire 42 so that it always extends through the same location between jaws 37 of clamping means 33. While guiding means 38 is shown as being located in front of clamp 33, i.e. between clamp 33 and bonding wedge 40, and guide means 36 is shown as being located behind clamp 33. Their positions may be interchanged and they may be used individually, in pairs or in the combination shown.

It has been found, that when typical prior art guide means such as wire guides 36, 38 are utilized, either as shown in FIG. 3 or interchanged, that it is extremely difficult to prevent small lateral displacements of the bonding wires and wire loops during bonding. When bonding is taking place, wire 42 is captured between bonding wedge 40 and bonding region 18, and jaws 37 of clamp means 33 are closed on the wire. Under these circumstances, portion 50 of wire 42 located between end 40E of bonding wedge 40 and jaws 37 of clamp means 33 is being held at both ends. It has been observed that the crushing of wire 42 associated with the wire bonding operation produces a minute lengthwise extension of wire 42 which is accommodated in portion 50. Since portion 50 is being held at both ends, this minute lengthwise extension of wire 42 can only be accommodated by bending of portion 50. Thus, a minute bend or kink is formed in portion 50 of wire 42 immediately behind end 40E of bonding wedge 40. This results in uncontrolled lateral displacement of this part of wire 42.

Under most circumstances where only a single wire bond loop is being employed or where adjacent wire bonds are 10–20 or more wire diameters apart this minute lateral displacement of the bonding wires is hardly noticeable. However, in the types of devices shown in FIG. 1 where wires 22, 24, 26 are very closely spaced and intended to be as nearly perfectly parallel and uniform as possible, even extremely minute lateral displacements of the bonded wires become very significant. For example, in high performance RF semiconductor devices or integrated circuits, where 1.5 mil gold bonding wires are used, adjacent wire spacings 23S, 25S (see FIG. 10 may be typically of the order of 8 mils, so that where overlapping bonds occur, minimum wire-to-wire spacing 27S may be as small as 4 mils. Under these circumstances, even very slight lateral or sideways displacements of the wires are extremely troublesome. Thus, these minute displacements which are ordinarily ignored in most assembly operations, even in high density integrated circuit applications, cause a major problem in connection with very high performance RF devices in which very closely spaced parallel wire bond loops must be employed.

It has been found that the foregoing and other problems associated with providing very closely spaced wire bond loops of controlled dimensions and orientations may be overcome by the means and method of the present invention which are illustrated in connection with FIGS. 6–7.

FIG. 6 shows a front view of wire clamping means 53 analogous to wire clamping means 33 of FIG. 3, but much enlarged. FIG. 7 shows a simplified right side view of the apparatus of FIG. 6. It is suggested that FIGS. 6–7 be considered together.

Jaw portion 57 of clamp 53 is analogous to jaw portion 37 of clamp 33. Typically, portion 53L of clamp 53 is fixed to frame 32 of the bonding machine while portion 53R is articulated so as to be able to open and close on wire 42. Gap 58 between jaws 57L, 57R is determined by the diameter of wire 42, but this is not essential. For simplicity, in FIG. 6, the general location of wire 42 between jaws 57L, 57R is indicated simply by a small circle denoted as 42 in FIG. 6.

Wire guide means 60, according to a preferred embodiment of the present invention and shown in front view in FIG. 6, is attached to fixed portion 53L of guide 53, by screws 52 through slot 63, but any convenient attachment arrangement may also be used. Guide 60 has central portion 64 which extends from fixed clamp portion 53L toward gap 58 between clamp jaws 57L, 57R.

Guide means 60 has end portion 66 containing slot 68 of width 70 which is slightly larger than the diameter of wire 42, as indicated by the a small circle denoted as 42 in FIG. 6. End portion 66 of guide 60 has terminal width 67 which is less than the smallest wire-to-wire spacing.

Slot 68 desirably has depth 72. Slot 68 desirably has open chamfered regions 74 at its terminal end 66 which faces toward bonding pad 18. End portion 66 of guide means 60 is desirably bent away from clamp jaws 57 by angle 76 in a direction toward bonding wedge 40. The relative orientation of bonding wire 42, clamp means 53 and guide means 60 is best understood by consideration of FIG. 7. The relationship between bonding wedge 40, clamp means 53, guide means 60, and bonding region 18 is illustrated schematically in FIG. 8. It is desirable that angle 76 be chosen so that end portion 66 of guide 60 is approximately perpendicular to wire 42.

Figure 7:
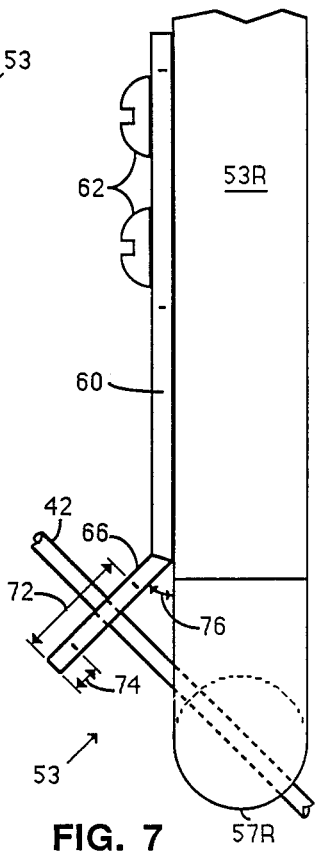
FIG. 7 is a side-view of the wire guiding means and clamping means of FIG. 6 showing its relationship to the bonding wire.
Figure 8:
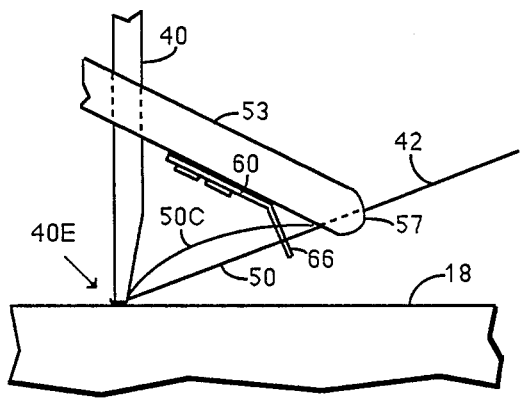
FIG. 8 is a side view of the wire guiding means and clamping means of FIG. 6, as well as bonding wedge 40 and bonding region 18, illustrating the bending of a portion of the bonding wire.

As those of skill in the art will appreciate by considering FIGS. 6–8 and the foregoing description, wire 42 is clamped under bonding wedge 40 and by jaws 57 during bonding. Accordingly, as the crushing of wire 42 at 45, 47 (see FIG. 5) occurs during bonding, thereby producing a minute increase in the length of portion 50 of wire 42 extending between wedge 40 and jaws 57, this additional length of the wire is absorbed by a slight bend or curve being formed in portion 50 of wire 42 as is illustrated in an exaggerated fashion at 50C in FIG. 8.

The operation of guide means 60 is to constrain the motion of wire bend 50C to lie in the plane of slot 68, which is substantially perpendicular to bonding pad 18. Thus, if the length extension of section 50 of wire 42 and therefore the amount of curve or bend 50C varies from bond to bond in an array of closely spaced wire bonds, the variation is accommodated by small variations of loop height 23H, 25H in FIG. 2. This is not harmful since the loop height is typically 1-2 orders of magnitude larger than the transverse wire-to-wire spacing. Thus, the present invention limits any variation in wire bond loops to occur in a direction which has minimal effect on the electrical properties.

Tests performed using the preferred embodiment of the invented wire guide for constraining motion of the wire to lie in the plane perpendicular to the plane of the bonding pad show that the amount of time required to adjust the wire bonders is much reduced since much larger variations in wire bond loop location or shape can now be accommodated without deleterious effect on the circuits. Further, whereas it was frequently necessary to manually straighten and align to an even spacing the multiple adjacent wire bonds in many devices and circuits, this is no longer necessary since the lateral spacing of the wires is now perfectly uniform even though very slight variations occur in the vertical loop heights. Thus, the resulting integrated circuits or RF transistors or modules not only have more consistent electrical properties but are cheaper to manufacture. These results are highly desirable.

EXAMPLE

Multiple wire bonds were produced using 1.5 mil gold wires to bond devices in an RF module containing semiconductor chips with metallized bonding pads of aluminum and metal regions of gold on a ceramic substrate. A type K & S 1470 U/S wire bonder manufactured by the Kulike and Soffa Corporation of Philadelphia, PA was utilized. Other than the installation of the wire guide described herein, the wire bonder was set for conventional operation. The wedge weight was established in the range of 40–100 grams with 50 grams being typical. A 20 millisecond delay was allowed after capturing the gold wire between the bonding wedge and the bonding pad before starting the ultrasonic transducer to form the bond. Ultrasonic transducer scrub times in the range 20–80 milliseconds, more conveniently 30–60 milliseconds and typically 40 milliseconds were used. High speed photography was used to examine the motion of the wire segment located between the bonding wedge and the clamp during bonding. It was observed that the heel portion of the wire between the clamp and the wedge was distorted during bonding.

Following bonding the clamp is released and the bonding wedge is retracted in the direction of the desired wire loop while the wire is being paid out through the tip of the bonding wedge to form the desired loop shape. The bonding wedge then comes to rest on the second bonding pad or bonding location with the wire captured between the bonding wedge and the bonding pad. The desired bonding weight, delay and ultrasonic transducer duration are then reapplied to form the second bond. If no further bonds are desired with the same unbroken wire, the clamp is slightly retracted to break the wire while the wedge continues to hold the bonded portion of the wire captive against the bonding pad. Because the bonding wire is weakest immediately adjacent to the bond, it breaks substantially at that point.

Where multiple parallel wire bonds are being made, the bonding wedge is then repositioned to a further bonding location, typically slightly displaced from the first bonding location, the bonding sequence repeated to form the third bond, additional wire paid out parallel to the first bond until the fourth bonding location is reached and the fourth bond completed. This sequence of events is repeated as many times as multiple bonding wires are required. The wire bond loops made using the wire guide of the present invention are substantially superior in terms of uniformity of spacing and parallelness. Also, much less time is needed for bonding tool alignment or straightening mis-aligned wire loops than has been obtained with the prior art wire guides.

Having thus described the invention, it will apparent to those of skill in the art that the invented method and structure provides improved wire bonding on semiconductor devices, integrated circuits and electronic assemblies, particularly those requiring many very uniform, closely spaced wires. Further, the resulting wire bond loop shape and location are much less sensitive to the particular adjustment conditions of the tool.

While the present invention has been described in terms of bonding particular wire materials to particular bonding pad materials, those of skill in the art will appreciate based on the description herein that the invented method and structure apply to a wide variety of bonding situations. Further, while the wire guide means of the present invention has been illustrated most conveniently as having a slot shaped arrangement in which the wire may move vertically but not horizontally, those of skill in the art will appreciate based on the description herein that other arrangements might also be used provided that they constrain the motion of the wire to a particular plane and preclude motion of the wire transverse thereto.

Accordingly, it is intended to include within the scope of the claims that follow all such variations and equivalents as will occur to those of skill in the art based on the teaching herein.

I claim:

1. An apparatus for attaching a wire to a bonding pad, comprising:
   bonding means for bonding the wire to the bonding pad;
   releasable clamping means for temporarily arresting longitudinal movement of the wire; and
   guide means located between the bonding means and the clamping means for permitting the wire to move longitudinally and perpendicular to the bonding pad but preventing the wire from otherwise moving substantially transversely.

2. The apparatus of claim 1 wherein the guide means permits the wire to move perpendicular to the bonding pad but substantially prevents the wire from moving transversely while the clamping means is engaged.

3. The apparatus of claim 1 wherein the guide means prevents the wire from moving in a direction parallel to the bonding pad and transverse to the longitudinal direction of the wire.

4. The apparatus of claim 1 wherein the guide means prevents the wire from moving in a direction parallel to the bonding pad and transverse to the longitudinal direction of the wire while the clamping means arrests the wire.

5. The apparatus of claim 1 wherein the wire has a predetermined diameter and the guide means comprises a slot for receiving the wire and having a width slightly larger than the wire diameter and a length of at least about five wire diameters.

6. The apparatus of claim 5 wherein the slot has a length of at least about ten wire diameters.

7. The apparatus of claim 1 wherein the guide means is mounted on the clamp means.

8. The apparatus of claim 1 wherein the guide means comprises a wire guiding slot oriented generally in a direction to permit vertical motion of the wire during bonding while restraining lateral motion.

9. The apparatus of claim 8 wherein the slot is open in a direction toward the bonding pad.

10. The apparatus of claim 1 wherein the guide means has a first end which is oriented generally toward the bonding pad, wherein the first end comprises a slot which is open toward the bonding pad.

11. The apparatus of claim 10 wherein the first end of the guide means is oriented substantially perpendicular to the bonding wire.

12. A method for attaching a fine wire to a bonding pad lying in a first predetermined plane, comprising:
   providing a bonding means for pressing the wire against the bonding pad, a clamping means in close proximity to the bonding means for temporarily stopping longitudinal motion of the wire and a guide means located between the bonding means and the clamping means for limiting motion of the wire;
   placing the bonding means on the bonding pad with the wire captured therebetween and the clamping means closed on the wire;
   bonding the wire to the bonding pad while allowing the wire between the bonding means and the clamp means to move within the guide means in a second plane perpendicular to the first plane while preventing motion of the wire in a direction substantially transverse to the second plane.

13. The method of claim 12 wherein the providing step comprises providing a guide means located between the bonding means and the clamping means for limiting motion of the wire to a second plane perpendicular to the first plane.

14. A method for attaching multiple closely and evenly spaced looped fine wires to bonding regions of an electronic device, comprising:
   providing a bonding means for pressing the wire against the bonding region, a clamping means in close proximity to the bonding means for temporarily stopping longitudinal motion of the wire and a guide means located between the bonding means and the clamping means for constraining motion of the wire to a plane substantially perpendicular to the bonding region;
   placing the bonding means on a first part of the bonding region with a first part of the wire captured therebetween and the clamping means closed on the wire;
   bonding the first part of the wire to the first part of the bonding region while allowing the wire between the bonding means and the clamp means to move within the guide means only in the plane while preventing motion of the wire in a first direction substantially transverse to the plane;

releasing the clamping means and moving the bonding means in a second direction to a second part of the bonding region;

bonding a second part of the wire to the second part of the bonding region;

cutting the wire adjacent the second part thereof without removing it from the guide means;

returning to a third part of the bonding region adjacent to but slightly spaced from the first part of the bonding region and repeating the placing, bonding, allowing, preventing and releasing steps; and moving the bonding means in a third direction parallel to the second direction to a fourth part of the bonding region and repeating the second bonding and cutting steps.

15. The method of claim 14 wherein the providing step comprises providing a guide means having a slot for constraining the wire to the plane.

16. The method of claim 15 wherein the providing step comprises providing a guide means having a slot for constraining the wire to the plane, wherein the slot is open toward the bonding pad.

* * * * *